United States Patent [19]

Arakawa

[11] Patent Number: 5,612,618
[45] Date of Patent: Mar. 18, 1997

[54] ROTATIONAL POSITION DETECTING DEVICE HAVING PEAK AND BOTTOM HOLD CIRCUITS

[75] Inventor: Miyao Arakawa, Nagoya, Japan

[73] Assignee: Nippondenso Co., Ltd., Kariya, Japan

[21] Appl. No.: 530,881

[22] Filed: Sep. 20, 1995

[30] Foreign Application Priority Data

Oct. 6, 1994 [JP] Japan ................... 6-242525

[51] Int. Cl.$^6$ .................. G01R 33/06; G01B 7/14; G01B 21/22; H03K 5/22

[52] U.S. Cl. .................. 324/207.25; 324/207.2; 327/511

[58] Field of Search ............... 324/207.2, 207.21, 324/207.25, 207.12, 225, 235, 251, 252, 174; 327/511; 338/32 R, 32 H

[56] References Cited

U.S. PATENT DOCUMENTS 5,442,283  8/1995  Vig et al. .................. 324/174

FOREIGN PATENT DOCUMENTS 63-190570  12/1988  Japan .
3-48715  5/1991  Japan .
4-346070  12/1992  Japan .
6-194188  7/1994  Japan .

*Primary Examiner*—Walter E. Snow
*Attorney, Agent, or Firm*—Cushman, Darby & Cushman IP Group of Pillsbury Madison & Sutro LLP

[57] ABSTRACT

Hall elements detects magnetic signals of a rotational member which is secured to the crank shaft or the cam shaft of an engine and converts them to an alternating electric signal. The electric signal is amplified by a differential amplifier and applied to a peak-detecting-type wave-shaping circuit which generates a rotational position signal and a control signal. A reset signal generator generates an interrupting signal in response to the control signal and is applied to a NAND circuit which is connected between the wave shaping circuit and an output circuit. When a power switch is closed, the power source voltage sometimes drops to an extremely low value for providing the rotational position detecting signal. At this moment, the reset signal generator generates the interrupting signal and closes the NAND circuit so that erroneous signal of the rotational position detecting signal is prevented.

16 Claims, 6 Drawing Sheets

ROTATIONAL POSITION DETECTING DEVICE HAVING PEAK AND BOTTOM HOLD CIRCUITS

CROSS REFERENCE TO RELATED APPLICATION

The present application is based on and claims priority from Japanese Patent Applications No. Hei 6-242525 filed on Oct. 6, 1994, the contents of which are incorporated herein by reference.

BACKGROUND OF THE INVENTION

1. Field of the Invention

The present invention relates to a rotational position detecting device for detecting rotational position, angle or rotational speed of the crank shaft or the cam shaft of an internal combustion engine.

2. Description of the Related Art

Conventional rotational position detecting devices are disclosed in Japanese Utility Model Unexamined publication Hei 3-48715 and Japanese Patent Unexamined Publication Hei 4-346070. The former discloses a sensor unit utilizing a pair of Hall elements to detect rotational position of a rotational member, and the latter discloses a circuit to detect peaks of signals of a sensor.

However, such combined device cannot detect normal peak voltage just after a power switch is turned on to energize the above devices combined together, thereby causing engine problems especially when the device is applied to detect each cylinder of an engine.

SUMMARY OF THE INVENTION

The present invention is made in view of the foregoing problems, and has a primary object of providing an improved rotational position detecting device which is free from the problems caused just after the power switch of the device is closed.

Another object of the present invention is to provide a circuit for detecting an inflection of an alternating signal generated in response to the rotational position and means for interrupting an error signal to pass to an output circuit when the switch is closed until the inflection is first detected.

A further object of the present invention is to provide a peak hold circuit, a bottom hold circuit, a pair of members for providing a pair of threshold values based on the maximum and minimum of the alternating signal, a pair of comparators for comparing the alternating signal with the threshold values, and a flip-flop circuit for generating signals having two levels which turn over each time a point of inflection is detected in the alternating signal.

A further object of the present invention is to provide, as the means for interrupting signal, a gate circuit and a reset signal generating circuit connected between the comparators and the gate circuit.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT

Preferred embodiments of the present invention will be described next with reference to the appended drawings.

Figure 1:
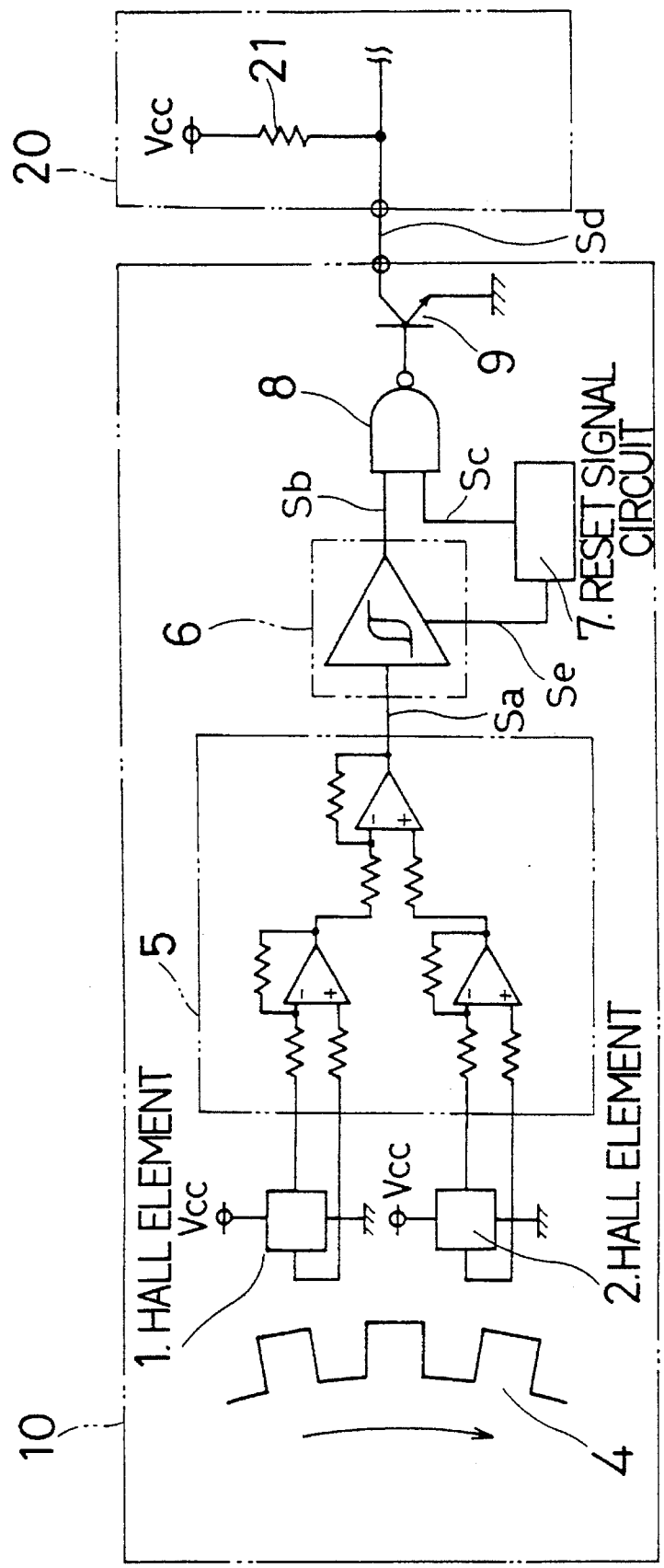
FIG. 1 is a circuit diagram of a rotational position detecting device according to a first embodiment of the present invention.
Figure 2:
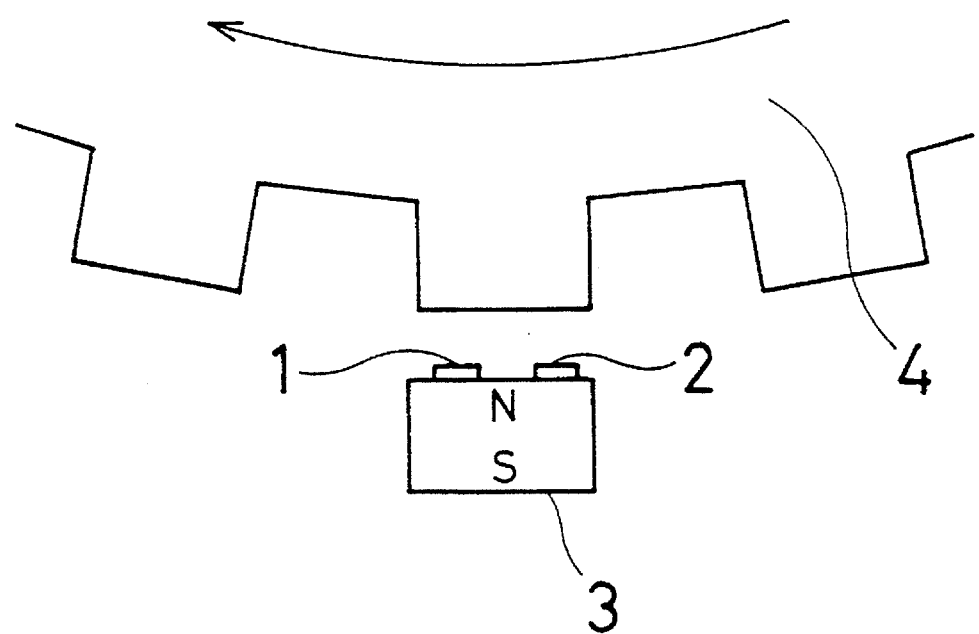
FIG. 2 is a schematic view illustrating a sensor portion shown in FIG. 1.

FIG. 1 illustrates a rotational position detecting device according to a first embodiment of the present invention and FIG. 2 shows schematically a sensor portion illustrated in FIG. 1.

The sensor portion of the rotational position detecting device 10 is mainly composed of Hall elements 1 and 2, a permanent magnet 3 and a rotor 4 as shown in FIG. 2. The rotor 4 has a disk made from a metal having high magnetic permeability and toothed periphery facing the Hall elements 1 and 2 at a certain air gap, and is secured to a rotary shaft, such as the crank shaft or the cam shaft of an engine. The tooth width and interval thereof are formed differently according to application of the device as described later. The permanent magnet 3 is disposed on the side of the Hall elements 1 and 2 opposite the rotor 4. The rotational position detecting device 10, which includes the Hall elements 1 and 2, is formed in a single-chip IC (not shown).

In FIG. 1, a constant voltage Vcc is applied to the Hall elements 1 and 2 from a constant voltage circuit (not shown) and output signals of the Hall elements 1 and 2 are applied to a differential amplifier 5. An output signal Sa of the differential amplifier 5 is applied to a peak-detecting type wave-shaping circuit 6. An output signal Sb of the peak-detecting type wave-shaping circuit 6 is applied to a NAND circuit 8 and another output signal Se of the peak-detecting type wave-shaping circuit 6 is applied to a reset signal generating circuit 7. An output signal Sc of the reset signal generating circuit 7 is applied to the NAND circuit 8. An output signal of the NAND circuit 8 is applied to the base of an NPN transistor which is an output stage transistor of a current drawing type power circuit 9. An output signal Sd of the rotational position detecting device 10 according to the first embodiment of the present invention is applied to an ECU (Electronic Control Unit) 20 and applied to a CPU (not shown) in the ECU 20 through a resistor 21.

The peak-detecting type wave-shaping circuit 6 will be described next with reference to FIG. 3.

Figure 3:
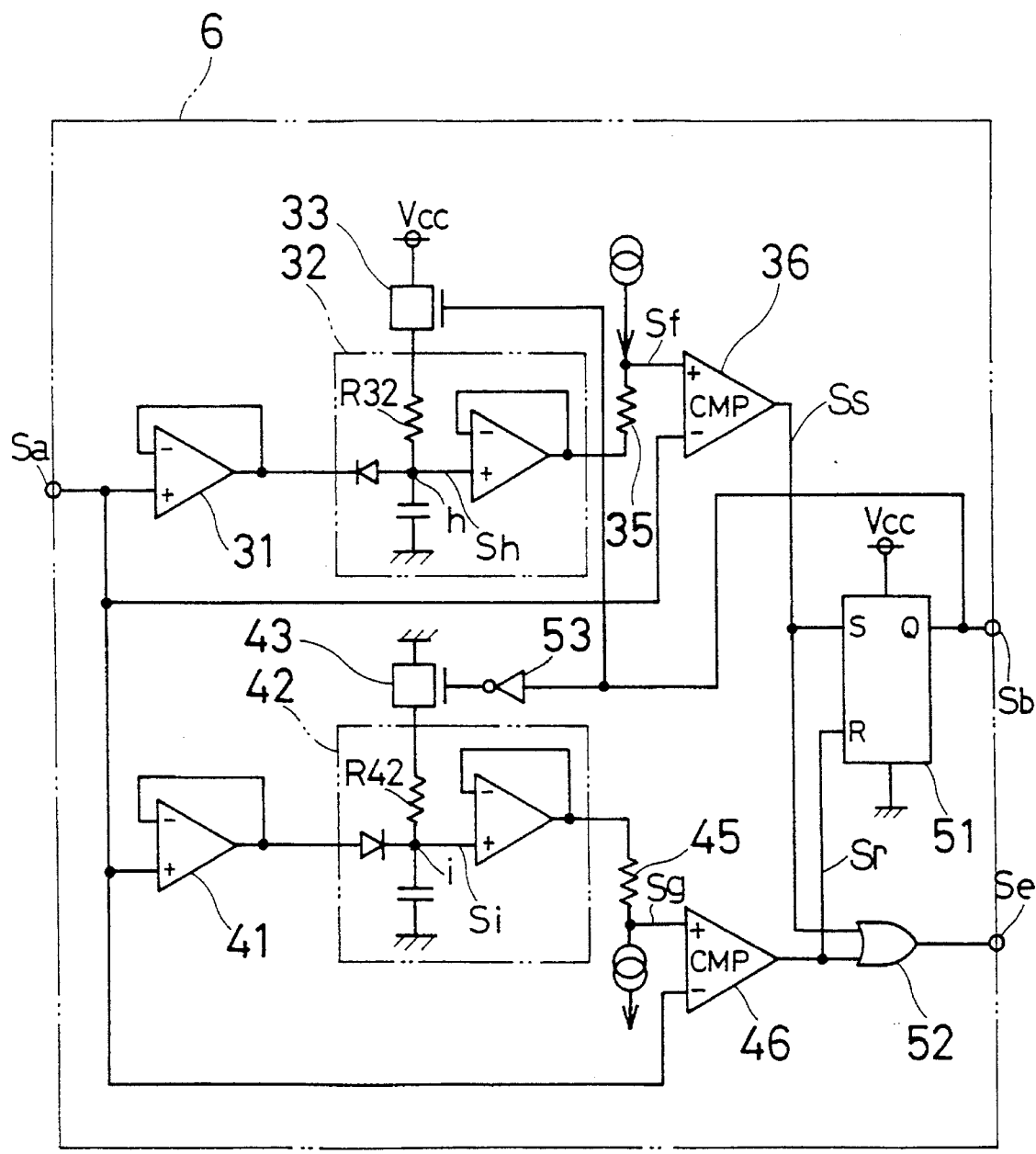
FIG. 3 is a detailed circuit diagram illustrating a peak-detecting-type wave shaping circuit.

In FIG. 3, the output signal Sa of the differential amplifier 5 is applied to voltage followers 31 and 41 and comparators 36 and 46, respectively. Output signals of the voltage follower circuits 31 and 41 are applied respectively to a bottom hold circuit 32 and a peak hold circuit 42. An output signal of the bottom hold circuit 32 is applied to the comparator 36 through a threshold resistor 35. An output signal of the peak hold circuit 42 is applied to the comparator 46 through a threshold resistor 45. The threshold resistors are connected to the constant current circuit to have constant currents flowing therethrough. An output signal Ss of the comparator 36 is applied to a terminal S of a flip-flop circuit 51 and an output signal Sr of the comparator 46 is applied to a terminal R of the flip-flop circuit. The output signals of the comparators 36 and 46 are also applied to an OR-circuit 52. An output signal Se of the OR-circuit 52 is a signal to be applied to the reset signal generating circuit 7 shown in FIG. 1. An output signal Sb of the flip-flop circuit 51 is a signal to be applied to the NAND circuit 8 shown in FIG. 1. The signal Sb of the flip-flop circuit 51 is also applied to an analog switch 33 and to an analog switch 43 through an inverter 53. The analog switch 33 is connected to the constant voltage source Vcc and a portion h for detecting a bottom hold wave Sh of the bottom hold circuit 32 through a resistor R32. The analog switch 43 is connected to a ground line and a portion i for detecting a peak hold voltage Si of the peak hold circuit 42 through a resistor R42.

Operation of the rotational position detecting device 10 will be described with reference to time charts of wave forms of various circuits thereof shown in FIGS. 4A through 4J.

Figure 4:
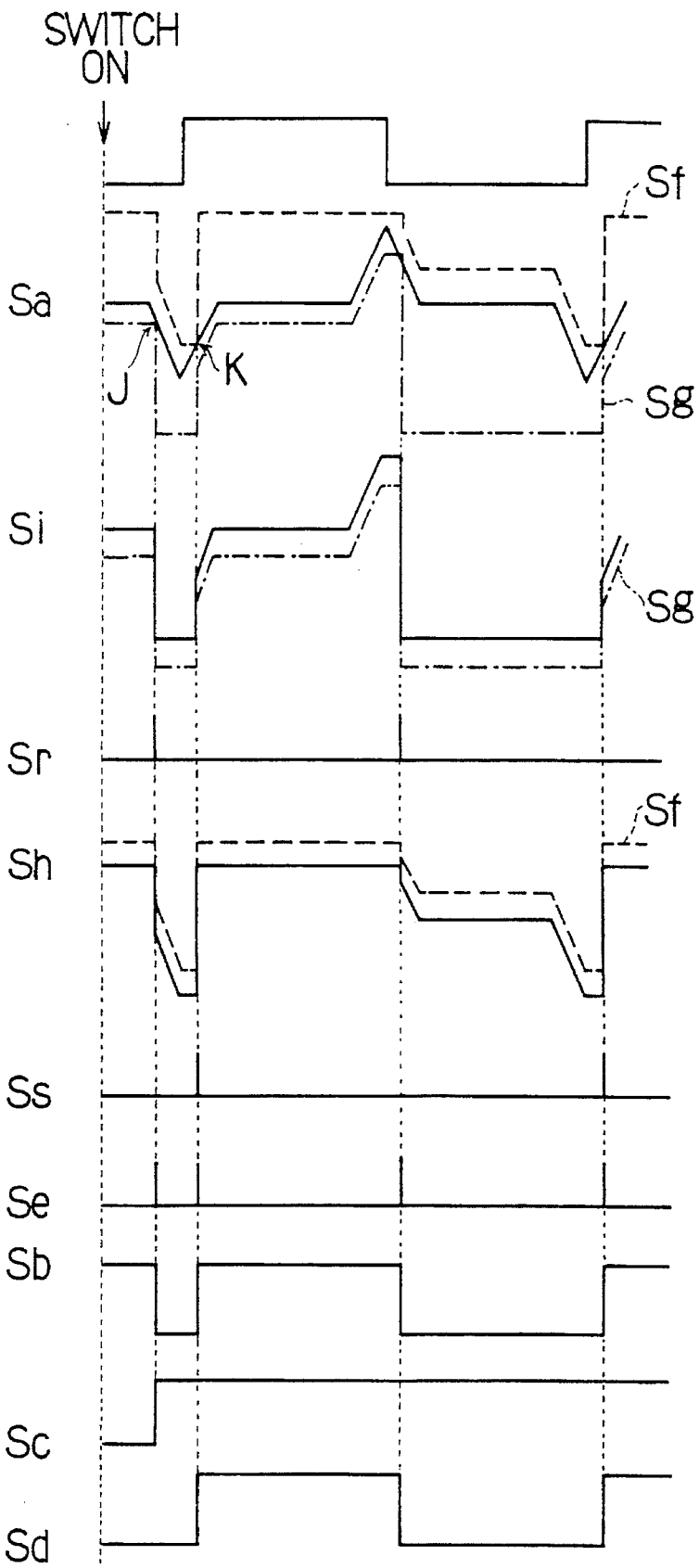
FIG. 4A, 4B, 4C, 4D, 4E, 4F, 4G, 4H, 4I and 4J are time charts illustrating respective waves of various positions in the rotational position detecting device according to the first embodiment.

When the rotor 4 having the toothed surface rotates, magnetic flux passing through the Hall elements 1 and 2 changes as shown in FIG. 4A, and the Hall elements generate voltage signals. The voltage signals are amplified by the differential amplifier 5 to form a signal wave Sa shown in FIG. 4B. When the signal wave Sa is applied to the peak-detecting type wave-shaping circuit 6, a peak hold voltage Si is generated during a positive half cycle of the signal Sa in the peak hold circuit 42 shown in FIG. 4C. At this time, since a constant current flows through the threshold resistor 45, a threshold voltage Sg which is a certain value lower than the peak hold voltage Si as indicated by chain lines in 4B and 4C is generated. The signals Sg and Sa are compared by the comparator 46 to generate a reset signal R shown in FIG. 4D to reset the flip-flop circuit 51 at a voltage a certain value lower than the peak hold voltage Si.

The bottom hold wave Sh shown in FIG. 4E is detected by the bottom hold circuit 32 in the same manner during a negative half cycle of the signal Sa. At this moment, a constant current flows through the threshold resistor 35 so that the threshold voltage Sf, which is a certain value higher than the bottom hold wave Sh indicated by a broken line in FIG. 4E, is generated. The signal waves Sf and Sa are compared by the comparator 36 to obtain a set signal shown in FIG. 4F which sets the flip-flop circuit 51 at a voltage a certain value higher than the bottom hold wave Sh. The bottom hold voltage and the peak hold voltage are renewed alternately by the output signal Sb through the analog switch 33 and 43. That is, the peak voltage detecting type wave-shaping circuit 6 detects a portion of inflection of the signal Sa. The output signals of the comparators 36 and 46 are applied to the OR circuit 52 and the output signal Se of the OR circuit 52 shown in FIG. 4G is applied to the reset signal generating circuit 7.

The reset signal generating circuit 7 generates a low level signal of the reset signal Sc as shown in FIG. 4I when a voltage of the electric source applied thereto becomes extremely low or just after a power switch is turned on, thereby holding the output signal Sd of the rotational position detecting device 10 to the low level as shown in FIG. 4J. When the electric source voltage becomes higher than a predetermined level, the level of the reset signal Sc is made high as shown in FIG. 4I. As a result, the output signal Sb shown in FIG. 4H of the terminal Q of the flip-flop circuit 51 of the peak-detecting type wave-shaping circuit 6 passes through the NAND circuit 8, and the output signal Sd of the rotational position detecting device 10 becomes high.

The peak-detecting type wave-shaping circuit 6 does not generate its output signal correctly until it detects a peak hold voltage or a bottom hold voltage. In other words, the peak-detecting type wave-shaping circuit 6 holds a voltage on the output terminal of the differential amplifier 5 as the peak hold voltage or the bottom hold voltage even when the electric source is switched on and the electric source voltage becomes extremely low.

In FIG. 4B, the output voltage (Sa) of the differential amplifier 5 at the switch-on moment is held by the peak hold circuit 42. Since the terminal Q of the flip-flop circuit 51 stays in the high level, the analog switch 33 is closed and the bottom hold circuit 32 does not function. The threshold voltage Sg is also set on the voltage held by the peak hold circuit 42 at this moment. Therefore, the output voltage Sa at the switch-on moment is compared with the threshold voltage Sg by the comparator 46, which reset the flip-flop circuit 51 at a point J shown in FIG. 4B to generate a low level temporary pulse (Sb) as shown in FIG. 4H. As a result, the analog switch 43 is closed and the peak hold circuit 42 stops its function. On the other hand, the analog switch 33 is opened and the bottom hold circuit 32 starts operation so that the output voltage Sa of the differential amplifier 5 is compared with the threshold voltage Sf by the comparator 36, and the set signal Ss shown in FIG.4F for the flip-flop circuit 51 is generated when the output signal Sa rises up to a normal point K in FIG. 4B. The peak hold circuit 42 and the bottom hold circuit 32 operate alternately thereafter.

The reset signal Sc becomes low when the power switch of the electric source is closed, and becomes high when the output signal(or reset-signal-off trigger pulse) Se of the OR circuit 52 is applied thereto. The output signal Sb of the flip-flop circuit 51 and the reset signal Sc of the reset signal generating circuit 7 are applied to the NAND circuit 8 to obtain the output signal Sd of the rotational position detecting device 10 without fail.

Next, a case in which the rotational position detecting device 10 is used with a cam rotor which is secured to the cam shaft as the rotor 4 shown in FIG. 2 will be described with reference to FIGS. 5A through 5D.

Figure 5:
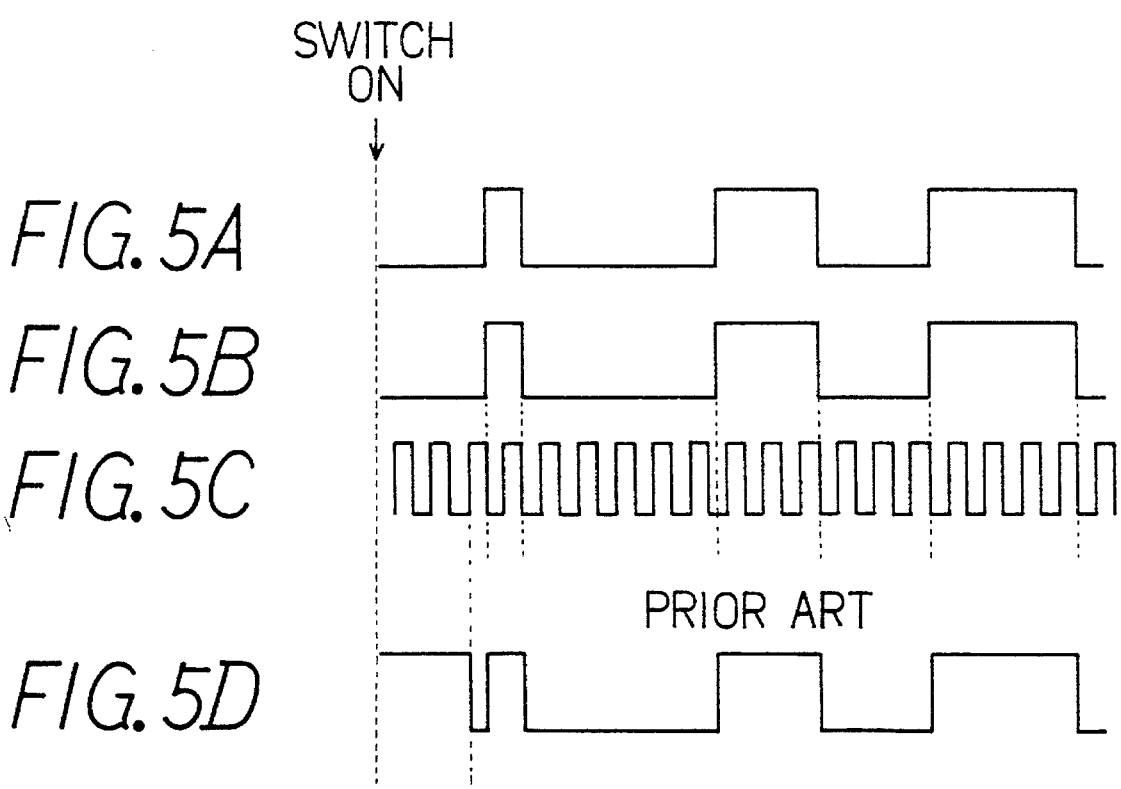
FIG. 5A, 5B, 5C and 5D are time charts for discussing advantages of the rotational position sensor according to the first embodiment.

FIG. 5A shows a wave form generated by the cam rotor (not shown). The cam rotor has teeth of different width to generate pulses having different width for each cylinder of the engine. A sensor output signal (FIG. 5B) is the output signal Sd of the rotational position detecting device 10 and almost the same as the signal of the cam rotor shown in FIG. 5A. FIG. 5C is an output signal of a crank sensor which is composed of the rotor 4 and the Hall elements 1 and 2 as shown in FIG. 2, for instance and generates a signal having the same pulses of an equal interval.

In the above system, the number of leading edges of the pulses of the signal shown in FIG. 5C during the high level of the output signal of the cam sensor shown in FIG. 5B is detected to identify the cylinder. FIG. 5D shows a signal of conventional rotational position detecting device. Since the conventional device does not have such signal stop circuit composed of the reset signal circuit 7 and a NAND circuit 8 in the above conventional device, an erroneous signal whose level becomes high may be generated when the power switch is closed, resulting in erroneous ignition signals causing engine problems.

If disconnection of wire between the current drawing type power circuit 9 and the ECU 20 exists, the input signal Sd of the ECU 20 is pulled up by the resistor 21 connected to the constant voltage source and becomes high. However, in the rotational position detecting device 10 according to the first embodiment, since the output terminal of the current drawing type power circuit 9 is forced to stay low when the power switch is closed, fault detection may be made before engine starting, thereby preventing damage of the device.

Figure 6:
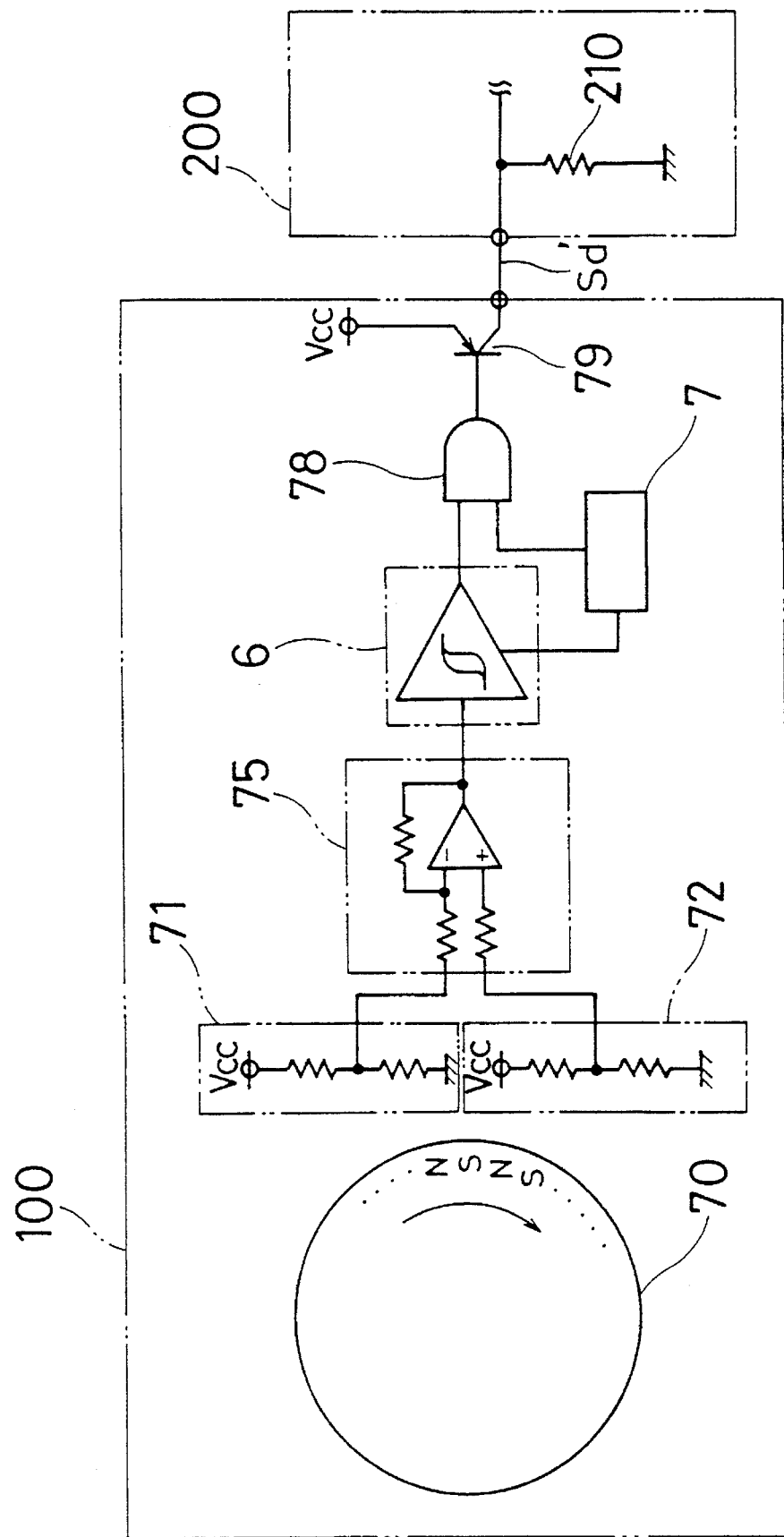
FIG. 6 is a circuit diagram of a rotational position sensor according to a second embodiment.

FIG. 6 is a circuit diagram of a rotational position detecting device according to a second embodiment of the present invention. The same reference numeral as used for the first embodiment indicates the same or equivalent part or portion, and detailed description thereabout will be omitted.

In FIG. 6, a rotational position detecting device 100 includes MREs (Magnetic Resistance Elements) 71 and 72 as sensor elements, a differential amplifier 75 which is simpler than the differential amplifier 5 of the first embodiment, a magnetized rotor 70, AND circuit 78 instead of the NAND circuit 8 of the first embodiment and a PNP transistor type power circuit instead of the current drawing (NPN transistor) type power circuit 9 of the first embodiment. An output signal Sd' of the rotational position detecting device 100 is applied to an input terminal of an ECU 200, which is connected to a CPU (not shown) through a resistor 210. The output signal Sd' of the rotational position detecting device 100 is held high when the power switch is closed.

A signal stop circuit which is composed of the reset signal generating circuit 7 and the AND circuit 78 holds the output signal of the power circuit 79 in the high level from when the power-switch is closed until a first portion of the inflection is detected. Since the normal output signal of the power circuit 79 is set high before operation, wire disconnection of the device is found easily by detecting low level of the output signal.

The sensor elements can be replaced with elements other than Hall elements and MREs if they generate alternating output signals in response to rotation of the rotor.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A rotational position detecting device connected to an electric power source through a switch comprising:

means for generating an alternating signal in response to rotation of a rotating member;

circuit means for generating a signal having two levels which turn over each time a point of inflection is detected in said alternating signal; and means connected to said circuit means for interrupting said signal of said circuit means when said switch is closed until said point of inflection is first detected, wherein said circuit means comprises:

a peak hold circuit for holding a maximum of said alternating signal;

a bottom hold circuit for holding a minimum of said alternating signal;

a first member for providing a first threshold value based on said maximum of said alternating signal;

a first comparator for comparing said alternating signal with said first threshold value;

a second member for providing a second threshold value based on said minimum of said alternating signal;

a second comparator for comparing said alternating signal with said second threshold value; and a flip-flop circuit connected to said first and second comparators for generating said signals having two levels which turn over each time a point of inflection is detected in said alternating signal.

2. A rotational position detecting device claimed in claim 1, wherein said means for interrupting signal comprises:

a signal amplifying circuit for amplifying said signal having two levels;

a gate circuit connected between said flip-flop circuit and said signal amplifying circuit; and a reset signal generating circuit connected between said first and second comparators and said gate circuit for controlling said gate circuit.

3. A rotational position detecting device claimed in claim 2, wherein said signal amplifying circuit comprises NPN power transistor.

4. A rotational position detecting device claimed in claim 2, wherein said signal amplifying circuit comprises PNP power transistor.

5. A rotational position detecting device claimed in claim 1, wherein said means for generating an alternating signal comprises a magnetic-field generator, a Hall element and a differential amplifier.

6. A rotational position detecting device claimed in claim 1 wherein said means for generating an alternating signal comprises a magnetic-field generator, a MRE element and a differential amplifier.

7. A rotational position detecting device claimed in claim 5 wherein said magnetic field generator comprises a rotor connected to said rotating member.

8. A rotational position detecting device claimed in claim 7 wherein said magnetic field generator including a plurality of magnetic members supplying different magnetic flux signal for identifying different rotational position.

9. A rotational position detecting device connected to an electric power source through a switch for detecting rotational position of a rotating member of an engine comprising:

a rotor having a plurality of projections and connected to said rotating member;

a signal generator for generating alternating signal in response to movement of said projections;

an amplifier connected to said signal generator for amplifying said alternating signal;

a peak hold circuit for holding a maximum value of said alternating signal;

a bottom hold circuit for holding a minimum value of said alternating signal;

a first member for generating a first threshold value based on said maximum value;

a second member for generating a second threshold value based on said minimum value;

a first comparator connected to said amplifier and said first member for generating a reset signal when said alternating signal becomes lower than said first threshold value;

a second comparator connected to said amplifier and said second member for generating a set signal when said alternating signal becomes higher than said second threshold value;

a flip-flop circuit connected to first and second comparators for generating a rotational base signal;

an output circuit; and means connected between said flip-flop circuit and said output circuit for invalidating said rotational base signal until one of said set signal and said reset signal is first generated after said switch is closed.

10. A rotational position detecting device claimed in claim 9, wherein said invalidating means comprises a control signal generating circuit connected to said flip-flop circuit for generating an invalidating signal when said switch is closed until one of said set signal and said reset signal is first applied thereto and a gate circuit connected between said control signal generating circuit and said output circuit for interrupting said rotational base signal when said invalidating signal is generated.

11. A wave shaping circuit connected to an electric power source through a switch for converting an alternating analog signal to a rectangular signal comprising:

a peak hold circuit for holding a maximum value of said alternating analog signal;

a bottom hold circuit for holding a minimum value of said alternating analog signal;

a first member for generating a first threshold value based on said maximum value;

a second member for generating a second threshold value based on said minimum value;

a first comparator connected to said signal generator and said first member for generating a reset signal when said alternating signal becomes lower than said first threshold value;

a second comparator connected to said signal generator and said second member for generating a set signal when said alternating signal becomes higher than said second threshold value;

a flip-flop circuit connected to first and second comparators for generating a rotational base signal;

an output circuit; and means connected between said flip-flop circuit and said output circuit for invalidating said rotational base signal when one of said set signal and said reset signal is first generated after said switch is closed.

12. A wave shaping circuit claimed in claim 11, generating circuit connected to said flip-flop circuit for generating an invalidating signal when said switch is closed until one of said set signal and said reset signal is first applied thereto and a gate circuit connected between said control signal generating circuit and said output circuit for interrupting said rotational base signal when said invalidating signal is generated.

13. A rotational position detecting device connected to an electric power source through a switch comprising:

a signal generator connected to a rotating member of an engine for generating alternating magnetic flux signal;

a converter circuit connected to said signal generator for converting said magnetic flux signal to an alternating electric signal;

a comparator circuit connected to said converter for generating a reset signal when said alternating electric signal becomes lower than a reset level and a set signal when said alternating electric signal is higher than a set level;

a flip-flop circuit connected to said comparator for generating a signal having two levels which turn over each time said set and reset signals are applied thereto;

an output circuit; and means connected between said flip-flop circuit and said output circuit for interrupting said signal of said flip-flop circuit unchanged until said set signal is first applied thereto after said switch is closed and said reset signal is first applied thereto.

14. A rotational position detecting device claimed in claim 13, wherein said signal generator comprises a cam rotor connected to a cam shaft of an engine.

15. A rotational position detecting device claimed in claim 13, wherein said comparator circuit comprises a peak hold circuit for holding a maximum value of said alternating electric signal; and a bottom hold circuit for holding a minimum value of said alternating electric signal.

16. A rotational position detecting device claimed in claim 13, wherein said interrupting means comprises:

a control signal generating circuit connected to said flip-flop circuit for generating an interrupting signal when said switch is closed until one of said set signal and said reset signal is first applied thereto and a gate circuit connected between said control signal generating circuit and said output circuit for interrupting said rotational base signal when said interrupting signal is generated.

* * * * *